United States Patent [19]

Goyal et al.

[11] Patent Number: 4,458,196
[45] Date of Patent: Jul. 3, 1984

[54] METHOD AND APPARATUS FOR HIGH SPEED RESISTANCE, INDUCTANCE AND CAPACITANCE MEASUREMENT

[75] Inventors: Ramesh C. Goyal, Bothell; Thomas H. Turnbull, Everett, all of Wash.

[73] Assignee: John Fluke Mfg. Co., Inc., Everett, Wash.

[21] Appl. No.: 290,247

[22] Filed: Aug. 5, 1981

[51] Int. Cl.³ .................................................. G01R 27/00
[52] U.S. Cl. ................................. 324/57 R; 324/57 PS
[58] Field of Search ............. 324/60 R, 60 CD, 57 SS, 324/57 R, 57 PS, 158 T

[56] References Cited

U.S. PATENT DOCUMENTS

| | | | |
|---|---|---|---|
| 3,260,936 | 7/1966 | Hewlett | 324/57 PS |
| 3,643,156 | 2/1972 | Stewart et al. | 324/57 R |
| 3,848,186 | 11/1974 | Martyashin | 324/57 R |
| 3,947,760 | 3/1976 | Noguchi et al. | 324/57 R |
| 3,986,108 | 10/1976 | Thomas | 324/60 |

FOREIGN PATENT DOCUMENTS

| | | | |
|---|---|---|---|
| 2646765 | 4/1977 | Fed. Rep. of Germany | 324/60 R |
| 581580 | 11/1977 | U.S.S.R. | 324/60 R |

OTHER PUBLICATIONS

Ichino et al.: "Vector Impedance Analysis to 1000 MHZ", HP Journal–Jan. 1980.
Avinor et al.: "Measurement of Inductance and Capacitance over Nine Decades"–Journal of Phys. & Sci. Instruments–Aug. 77–pp. 771-773–Sencore News–Jun. 1971–p. 3.

Primary Examiner—Stanley T. Krawczewicz
Assistant Examiner—Jose M. Solis
Attorney, Agent, or Firm—Gary S. Kindness; Mikio Ishimaru; Stephen A. Becker

[57] ABSTRACT

A method of, and an apparatus for, high speed resistance (R), inductance (L) and capacitance (C) measurement is disclosed. A voltage or current based excitation signal having a very low voltage level and a predetermined waveform is applied to the item whose R, L or C parameter(s) is (are) to be measured; and, voltage measurements are made at predetermined points in the time domain of the output voltage waveform. Whether the excitation signal is voltage based or current based, the particular shape of the waveform (preferably trapezoidal or dual polarity rectangular wave) and the voltage measurement points in the time domain of the output voltage waveform are determined by: (i) the nature of the parameter (R, L or C) to be measured; (ii) the magnitude of the parameter (small or large) in the case of R and C parameters; and, (iii) the series/parallel nature of the parameters in situations where significant amounts of two parameters coexist in the item being measured. The measured voltage values are used to determine the value(s) of the R, L or C parameter(s). The voltage level of the excitation signal can be maintained below the activation level of contemporary printed circuit board active circuit elements (e.g., transistors), without loss of accuracy. As a result, the invention can be used to measure the R, L and C parameters of in-circuit components.

34 Claims, 7 Drawing Figures

METHOD AND APPARATUS FOR HIGH SPEED RESISTANCE, INDUCTANCE AND CAPACITANCE MEASUREMENT

TECHNICAL AREA

This invention is directed to methods and apparatus for measuring the parameters of electronic items and, more particularly, methods and apparatus for measuring the resistance, inductance and capacitance parameters of electronic items.

BACKGROUND OF THE INVENTION

In the past, the time required to accurately measure the resistance (R), inductance (L) or capacitance (C) parameter(s) of an electronic item (such as a semiconductor, resistor, inductor or capacitor, or a circuit combination thereof) has been undesirably long. Prior art resistance measurement methods intentionally have been made slow in order to avoid errors created by the parasitic capacitances present in any measurement apparatus. Contemporary prior art capacitance and inductance measurement methods have been slow due to their use of sinusodial excitation in combination with bridge-type resonance circuits, which must be balanced during the measurement sequence. As a result, high speed measurement rates, in the order of 1,000 measurements/second, have not been achievable.

Therefore, it is an object of this invention to provide a new and improved electronic measurement method and apparatus.

It is a further object of this invention to provide a new and improved method and apparatus for measuring the resistance, inductance and capacitance parameters of electronic items.

It is a still further object of this invention to provide a high speed method and apparatus for measuring the resistance, inductance and capacitance parameters of electronic items.

Another disadvantage of prior art R, L and C parameter measuring methods and apparatus is their inability to accurately measure the parameters of in-circuit components. The primary reason for this disadvantage is that R, L and C testing requires some form of external excitation. If the voltage level of this excitation signal is above the actuation voltage level of active devices connected in-circuit with the component to be tested, the active devices are made conductive. This creates an erroneous result due to the opening of circuit paths that draw current away from the component to be tested. More specifically, when the open circuit paths draw the external excitation current away from the component to be tested, they accordingly modify any measurements being made. Because the additional current draw is unknown, the resulting measurements cannot be modified in a compensating manner. One way of avoiding this problem is to maintain the voltage level of the excitation signal beneath the activation voltage level of the active device or devices connected in-circuit with the component whose parameters(s) is (are) being measured. In the past, this technique has had the disadvantage that measurement accuracy has dropped when this procedure has been followed.

Therefore, it is a still further object of this invention to provide a new and improved method and apparatus for measuring the resistance, inductance and capacitance parameters of electronic components mounted in-circuit.

It is still another object of this invention to provide a method and apparatus for rapidly and accurately measuring the resistance, inductance and capacitance parameters of electronic components while said components are mounted in-circuit.

SUMMARY OF THE INVENTION

In accordance with this invention, a method of, and an apparatus for, high speed resistance (R), inductance (L) and capacitance (C) measurement is provided. In accordance with the method of the invention, a voltage or current based signal excitation having a very low voltage level and a predetermined waveform is applied to the item whose R, L or C parameters(s) is (are) to be measured; and, voltage measurements are made at predetermined points in the time domain of the output voltage waveform. Whether the excitation signal is voltage based or current based, the particular shape of the waveform (preferably trapezoidal or dual polarity, rectangular wave) and the voltage measurement points in the time domain of the output voltage waveform are determined by: (i) the nature of the parameter (R, L or C) to be measured; (ii) the magnitude of the parameter (small or large) in the case of R and C parameters; and, (iii) the series/parallel nature of the parameters in situations where significant amounts of two parameters coexist in the item being measured. The voltage measurements are used to determine the value(s) of the R, L or C parameter(s) being determined.

In accordance with further aspects of the invention, in situations where the item whose R, L or C parameters are being measured is a component connected in an electronic circuit, the voltage level of the excitation signal is maintained below the activation voltage level of active circuit elements connected in circuit with the component whose R, L or C parameter(s) is (are) being measured. By maintaining the excitation signal voltage below the activation voltage level of the active circuit elements, erroneous results created by the actuation of such elements are avoided. This result is accomplished without the loss of accuracy that occurred in the past when low voltage level excitation signals were utilized in "in-circuit" RLC measuring apparatus. Accuracy is retained because voltage measurements are made only at selected points in the time domain of the output voltage waveform, rather than the entire waveform being tracked or measured. Further, this differential measurement technique, i.e, measuring only at selected points in the time domain of the output voltage waveform, eliminates errors due to noise, offset voltages and other sources.

In addition to the advantage of being applicable to the measurement of the R, L and C parameters of in-circuit components, the method and apparatus of the invention has other advantages. For example, the method and apparatus can be used to accurately perform relatively high speed measurements, in the range of 1,000 measurements per second. Moreover, the separate R, L and C parameter values of multiple parameter components can be determined in a single measurement cycle. That is, the individual parameters (R, L or C) of parallel RC or series RL or RC combinations can be determined in a single measurement cycle.

BRIEF DESCRIPTION OF THE DRAWINGS

The foregoing objects and many of the attendant advantages of this invention will become more readily appreciated as the same becomes better understood by reference to the following detailed description when taken in conjunction with the accompanying drawings, wherein.

DESCRIPTION OF THE PREFERRED EMBODIMENT

The present invention is directed to a method of, and an apparatus for, making high speed resistance, inductance and capacitance measurements. In general, voltage or current based excitation signals having a very low voltage level and a predetermined waveform are applied to the item whose R, L or C parameter(s) is (are) to be measured; and, voltage measurements are made at predetermined points in the time domain of the output voltage waveform. The choice of whether the excitation signal is voltage based or current based, the particular shape of the waveform (preferably, trapezoidal or dual polarity rectangular wave) and the voltage measurement points in the time domain of the output voltage waveform are determined by: the nature of the parameter (R, L or C) to be measured; the magnitude of the parameter (small or large) in the case of R and C parameters; and, the series/parallel nature of the parameters in situations where significant portions of two parameters coexist in the item being measured.

Figure 1:
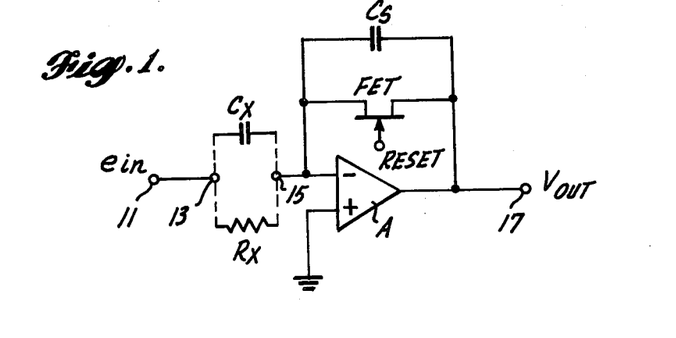
FIG. 1 is a schematic diagram of a circuit formed in accordance with the invention suitable for making resistance measurements, capacitance measurements or parallel resistance and capacitance measurements.
Figure 2:
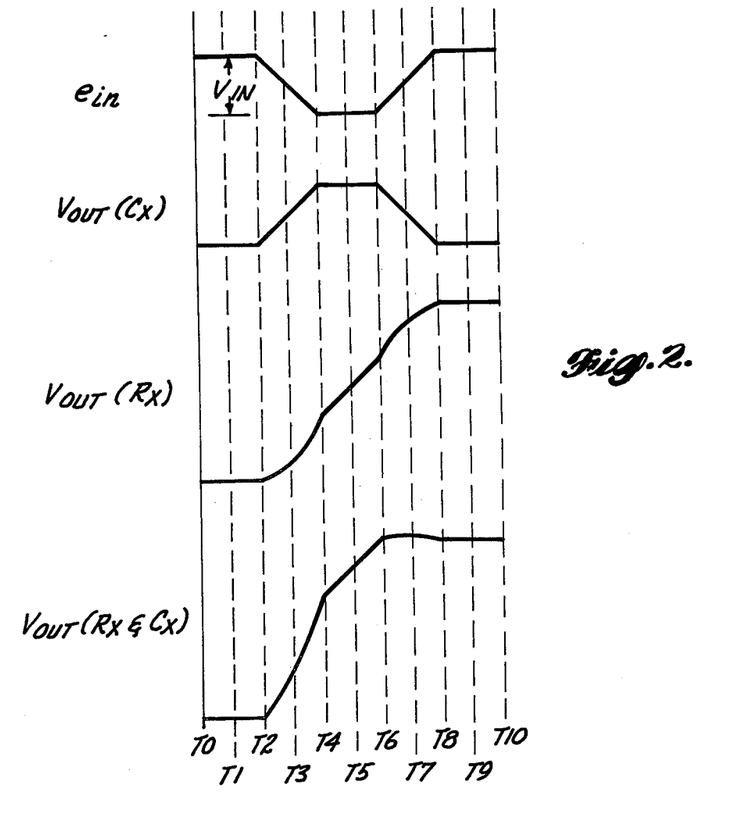
FIG. 2 is an excitation signal waveform diagram and series of output signal waveform diagrams illustrating the operation of the circuit illustrated in FIG. 1.
Figure 3:
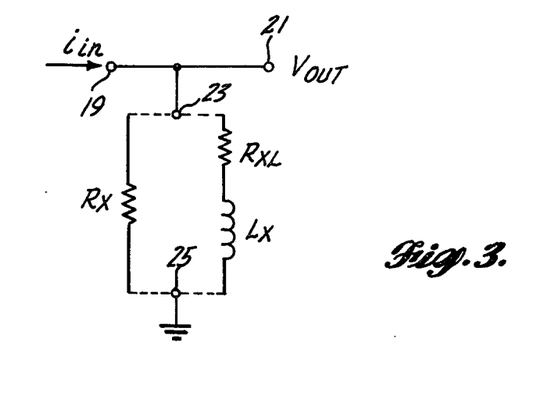
FIG. 3 is a schematic diagram of a circuit formed in accordance with the invention suitable for making resistance measurements, inductance measurements, and series resistance and inductance measurements.
Figure 4:
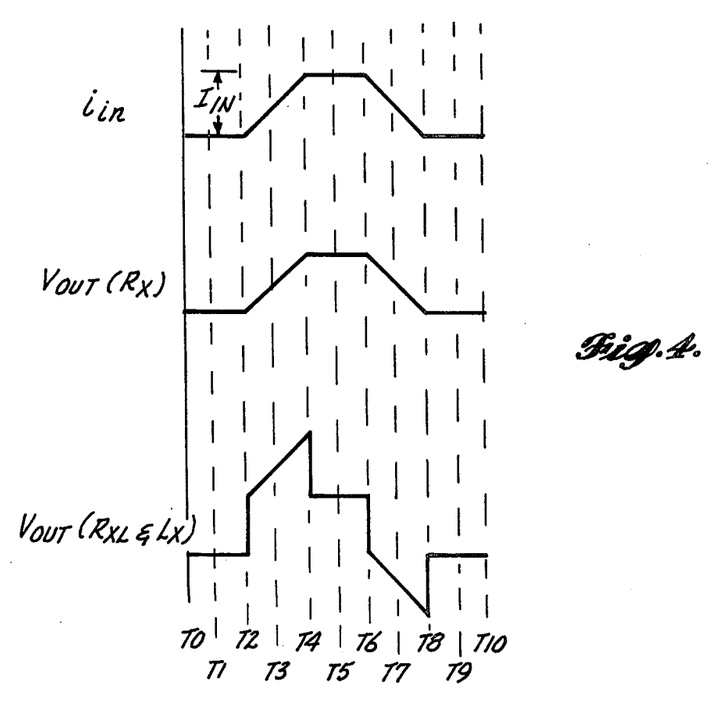
FIG. 4 is an excitation signal waveform diagram and a series of output signal waveform diagrams illustrating the operation of the circuit illustrated in FIG. 3.
Figure 5:
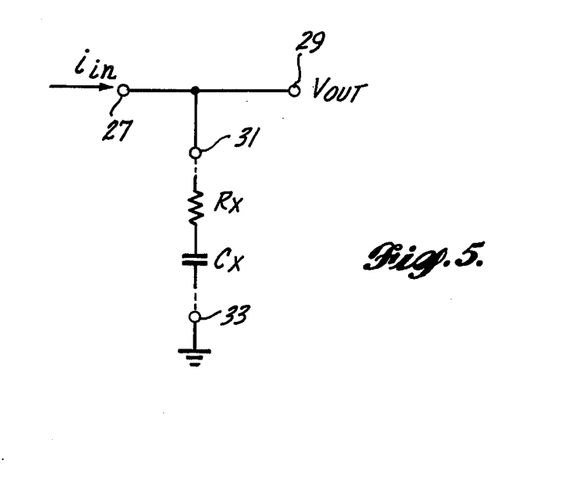
FIG. 5 is a circuit diagram formed in accordance with the invention suitable for making resistance measurements and series resistance and capacitance measurements.
Figure 6:
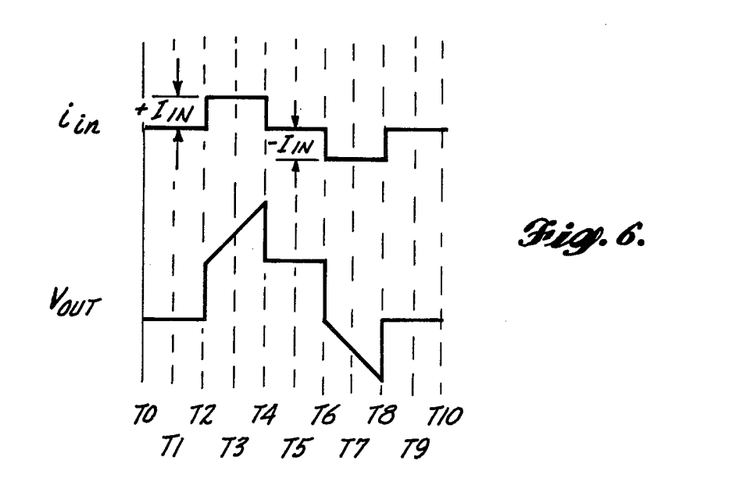
FIG. 6 is a excitation signal waveform diagram and an output signal waveform diagram illustrating the operation of the circuit illustrated in FIG. 5.
Figure 7:
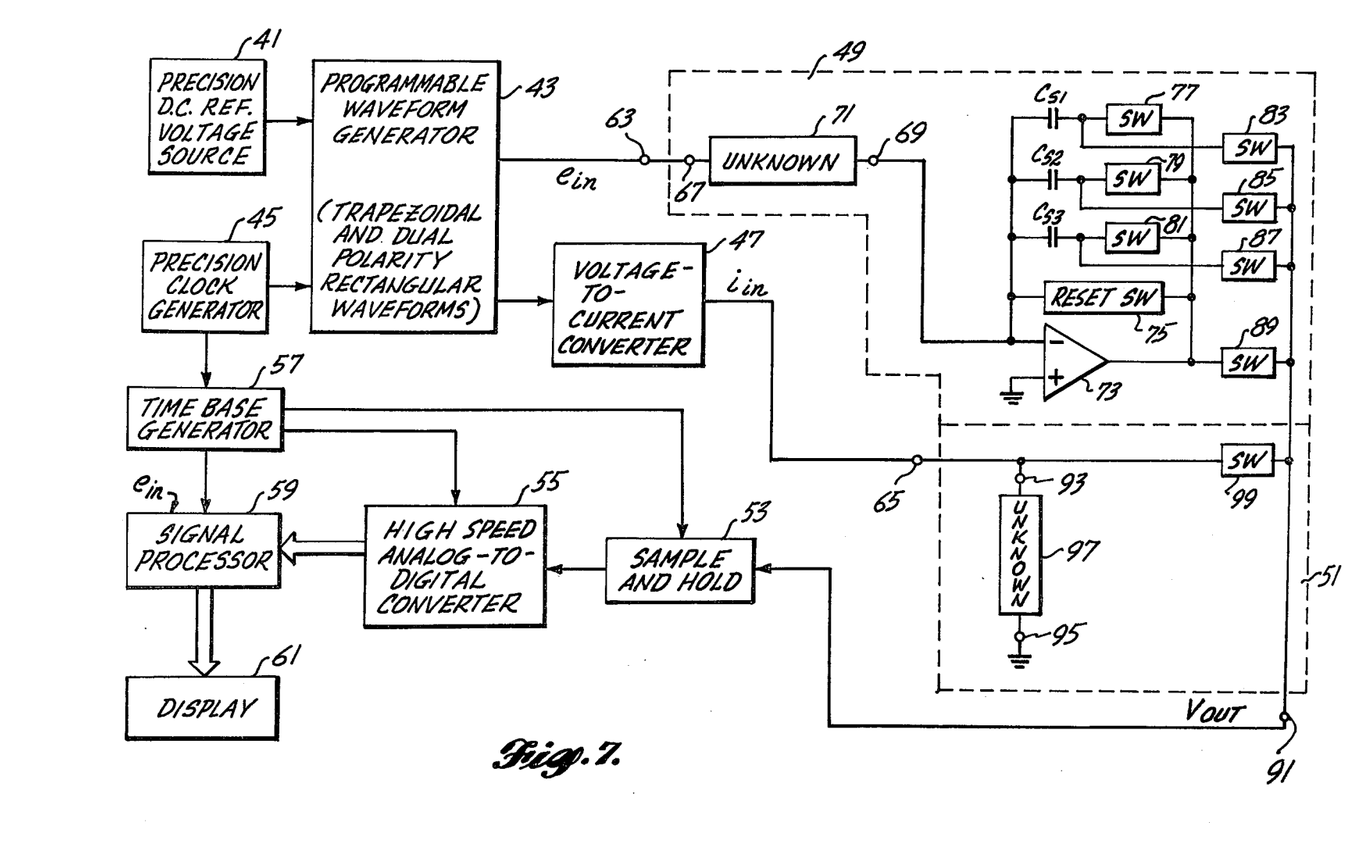
FIG. 7 is a block diagram of a resistance, inductance and capacitance measuring apparatus formed in accordance with the invention, which incorporates circuits of the type illustrated in FIGS. 1, 3 and 5.

The preferred embodiment of the invention illustrated in FIG. 7 includes various subsystems that can be adjusted to: (1) develop appropriately based (e.g., voltage or current) excitation signals having the desired waveform (e.g., trapezoidal or dual polarity rectangular wave); and, (2) make voltage measurements at the required points in the time domain of the output voltage waveform. However, because the embodiment of the invention illustrated in FIG. 7 will be more readily understood by first considering the individual combinations of these items separately, such combinations are presented and described first. In this regard, FIGS. 1, 3 and 5 illustrate various circuits formed in accordance with the invention that, when stimulated by suitable current or voltage based excitation signals having the required waveform, produce output voltages having measurable points in the time domain of the output voltage waveform usable by the invention to determine the R, L or C value of the item being excited by the excitation signal. That is, when voltage measurements are made at predetermined points in the time domain of the output voltage waveforms produced when such circuits are suitably excited, the voltage measurements can be utilized to determine the value of R, L or C parameters, as required. The waveforms of the voltage or current based excitation signals applied to the circuits illustrated in FIGS. 1, 3 and 5 are illustrated on the first lines of FIGS. 2, 4 and 6, respectively. The remaining lines of FIGS. 2, 4 and 6 illustrate the output voltage waveform that occurs based on the dominant parameter or parameters (R, L, or C) of the item whose parameters are being measured.

In addition to being able to make high speed R, L and C measurements of detached electronic items, i.e., components, circuits, etc., the invention is also suitable for use in making high speed R, L and C parameter measurements of electronic components connected in-circuit. In such cases, in addition to having a predetermined waveform and a predetermined base (e.g., current or voltage), the voltage magnitude of the excitation signal is maintained below the activation level of active components connected in-circuit with the component whose parameter(s) is (are) being measured. In most instances keeping the excitation voltage below 0.5 volts, which is the required bias voltage of the majority of electronic components presently utilized in the manufacture of printed circuit board subsystems, will accomplish this result. Thus, preferably, the peak-to-peak voltage of the excitation signal is 0.4 volts. Contrariwise, if the bias voltage level of in-circuit active components is lower, the peak-to-peak voltage of the waveform can be lower, down to 0.1 volts.

Turning now to the drawings, FIG. 1 is a schematic diagram of a circuit formed in accordance with the invention suitable for use in making high resistance, low capacitance or parallel resistance and capacitance measurements. The circuit illustrated in FIG. 1 comprises: a conventional DC operational amplifier designated A, having a high gain; a field effect transistor switch designated FET; and, a standard capacitor designated $C_S$. Connected across the inverting input and the output terminals of A are the source and drain terminals of FET. $C_S$ is also connected across the inverting input and the output terminals of A. The gate of FET is connected to a suitable reset voltage source (not shown) adapted to turn FET on when the herein-described circuit is to be reset. Thus, the circuit is reset by shorting the terminals of $C_S$, which discharges any residual charge on $C_S$. An input terminal 11 which receives an excitation signal, $e_{in}$, of the type illustrated on the first line of FIG. 2 and hereinafter described, is connected to a first test terminal 13. A second test terminal 15 is connected to the inverting input of A. The item to be tested is connected across test terminals 13 and 15, as generally illustrated by the dotted connection lines in FIG. 1. The item to be tested may have parallel resistance and capacitance properties, which are denoted $R_x$ and $C_x$. Further either parameter (i.e., $R_x$ or $C_x$) may predominate to the point where the other parameter is insignificant or nonexistent.

The noninverting input of A is connected to ground. The output of A is also connected to an output terminal 17. The hereinafter described measurements made at predetermined points in the time domain of the output voltage, $V_{OUT}$, are made at output terminal 17.

In addition to illustrating the waveform of $e_{in}$, FIG. 2 also illustrates the waveform of $V_{OUT}$, which depends on the predominant parameters of the electronic item whose RC parameters are being measured. The second line of FIG. 2 illustrates the waveform of $V_{OUT}$ when the predominant parameter is capacitance (represented by $C_x$). The third line illustrates the waveform of $V_{OUT}$ when the predominant parameter is resistance (represented by $R_x$); and, the fourth line of FIG. 2 illustrates the waveform of $V_{OUT}$ when neither parameter is truly predominant (represented by $R_x$ and $C_x$).

The waveforms illustrated in FIG. 2 are broken into five equal time domain intervals. Each time domain interval has the value T. The time domain intervals are denoted by the even numerical identifiers that start from T0 and extend through T10. Thus, the first interval is from T0 to T2, the second interval is from T2 to T4, etc., through the fifth interval which extends from T8 to T10. As required, output voltage waveform measurements are made at the midpoint of each T-interval. These midpoints are denoted by the odd numerical identifiers T1, T3, T5, T7 and T9.

From T0 to T2, the waveform of $e_{in}$ is at a predetermined first voltage level, such as 0. From T2 to T4, $e_{in}$ linearly decreases to a second voltage level. The voltage difference between the first and second voltage levels is denoted $V_{IN}$. Between T4 and T6, $e_{in}$ remains at the second voltage level. From T6 to T8, $e_{in}$ linearly increases to the first voltage level. From T8 to T10, $e_{in}$ remains at the first voltage level. As will be readily appreciated from this description, the waveform of $e_{in}$ is a negative going trapezoid.

Turning now to a description of the operation of the circuit illustrated in FIG. 1; when an excitation signal, $e_{in}$, having a waveform of the type illustrated in the first line of the FIG. 2 is applied to an item whose R and/or C parameters are to be measured, an output voltage having a certain waveform will be produced. The shape of the waveform will depend upon the values of the R and C parameters. Examples of such waveforms are illustrated on the second, third and fourth lines of FIG. 2.

As will be readily appreciated by those familiar with electronic circuit analysis, regardless of whether the item whose parameters are to be measured is predominantly capacitive or resistive, the capacitive parameter $C_x$ and the resistive parameter $R_x$ independently control portions of the output voltage. Because the output voltage is definable by an equation, the equation can be formatted in a manner that includes terms for each parameter. That is, each of these parameters can be represented as an independent term in a generic equation representing the output voltage $V_{OUT}$. More specifically, the peak-to-peak output voltage $V_{OUT}$ can be represented by the following equation:

$$V_{OUT} = -\left( \frac{C_x}{C_s} V_{IN} + \frac{1}{R_x C_s} \int_0^t e_{in} dt \right) \quad (1)$$

where: $V_{IN}$ is the excitation voltage difference existing at two output measurement points (chosen to coincide with input peak-to-peak voltage points as illustrated in FIG. 2); $e_{in}$ is the instantaneous value of the excitation voltage; $K_1$ represents the gain of A; and, the other terms are the values of the illustrated components.

If it is assumed that capacitance is the dominant parameter of the item being measured, the value of $R_x$ goes to infinity, whereby Equation (1) reduces to:

$$V_{OUT} = -\frac{C_x V_{IN}}{C_s} \quad (2)$$

which can be rearranged to form the following equation:

$$C_x = -\frac{V_{OUT} C_s}{V_{IN}} \quad (3)$$

The output voltage waveform of the circuit illustrated in FIG. 1, when the item being measured is predominantly capacitive, is shown on the second line of FIG. 2. In this instance the output voltage is a positive going trapezoid having a time base that follows $e_{in}$. Thus $V_{OUT}$, which is the peak-to-peak output voltage, can be determined by making measurements at T5 and T1 and determining the difference therebetween. When this is done the value of $C_x$ can be determined using Equation (3), assuming that the value of C is known and the value of $V_{IN}$ is either measured or known. In other words, Equation (3) can be rewritten as follows:

$$C_x = -\frac{(V_{T5} - V_{T1}) C_s}{V_{IN}} \quad (4)$$

where $V_{T5}$ and $V_{T1}$ denote the output voltage measured at times T5 and T1, respectively.

If it is now assumed that the component to be measured is predominantly resistive, i.e. it has no significant capacitive parameter, the first term of Equation (1) vanishes. The remaining portion of the equation can be utilized to determine the value of $R_x$. The remaining portion reads as follows:

$$V_{OUT} = -\frac{1}{R_x C_s} \int_0^t e_{in} dt \quad (5)$$

A trapezoidal excitation signed waveform, $e_{in}$, of the type shown on the first line of FIG. 2, causes the waveform of the output voltage, $V_{OUT}$, to have the form illustrated in the third line of FIG. 2, when the item being measured is predominantly resistive. As shown, the waveform of $V_{OUT}$ increases during the voltage falling, level and rise periods of $e_{in}$. As a result, Equation (5) can be broken into three distinct portions, one of which represent each of these three distinct periods. When this is done, the following equation is produced:

$$V_{OUT} = -\frac{1}{R_x C_s} \left[ \int_{T2}^{T4} e_{in} dt + \int_{T4}^{T6} e_{in} dt + \int_{T6}^{T8} e_{in} dt \right] \quad (6)$$

Using conventional Laplace transform techniques, the foregoing equation can be changed to the following form:

$$V_{OUT} = -\frac{1}{R_x C_s} \left[ \frac{V_{IN}}{T} \left( \frac{T^2}{2} \right) + V_{IN}T + V_{IN}T = \frac{V_{IN}}{T} \left( \frac{T^2}{2} \right) \right] \quad (7)$$

which can be reduced to the following equation:

$$V_{OUT} = -\frac{1}{R_x C_s} (2V_{IN}T) \quad (8)$$

Rearranging the terms of Equation (8) and replacing $V_{OUT}$ with $V_{T9}-V_{T1}$ results in $R_x$ being defined by the following equation:

$$R_x = -\frac{2V_{IN}T}{C_s(V_{T9} - V_{T1})} \quad (9)$$

In Equation (9), $V_{IN}$, of course, is the peak-to-peak input voltage difference previously discussed. $V_{T9}-V_{T1}$ is equal to $V_{OUT}$ because $V_{OUT}$ is the difference between the voltage present at the beginning and the voltage present at the end of the excitation waveform cycle. This voltage can be readily determined by making output voltage measurements at T1 and T9, whereby $V_{OUT}$ can be represented by $V_{T9}-V_{T1}$ as shown. As previously described, T is equal to one of the five equal time intervals of the input waveform, i.e., the time from T0 to T2, the time from T2 to T4, etc.

The last line of FIG. 2 illustrates the waveform of $V_{OUT}$ that occurs when the item being measured includes significant amounts of both capacitance and resistance. Using the same type of analysis described above it can be mathematically shown that the capacitance value can be determined in accordance with the following equation:

$$C_x = -\frac{V_{T5} - \frac{1}{2}V_{T9}}{V_{IN}} C_s \quad (10)$$

where $V_{T5}$ and $V_{T9}$ are the output voltages measured at times T5 and T9, respectively. In this instance, $R_x$ is still defined by Equation (9).

At this point, it should be readily appreciated by those skilled in the electronic parameter measuring and testing art that a circuit of the type illustrated in FIG. 1, when excited by a voltage based trapezoidal waveform of the type illustrated in the first line of FIG. 2, can be utilized to measure resistance, capacitance or the resistance and capacitance of a component that includes both parameters. This circuit is ideally suited for use when the value of capacitance is relatively low, for example, in the range of between 10 pf to 1.25 mf. With respect to resistance values, FIG. 1 is ideally suited for use when the resistance value is relatively large, for example in the range of 320 ohms to 20 megohms.

FIG. 3 illustrates a circuit formed in accordance with the invention suitable for use in determining the value of relatively small resistances, inductances and, if appreciable (as it is in almost all inductors), the series resistance of an inductance item. In essence, the circuit includes an input terminal 19 at which a current based excitation signal, $i_{in}$, of the type illustrated in the first line of FIG. 4 and herein described is applied. The input terminal 19 is connected to an output terminal 21 at which the output voltage, $V_{OUT}$, is measured at predetermined points in the time domain of the output voltage waveform. The input and output terminals are also connected to a first test terminal 23. A second test terminal 25 is connected to ground. The item whose resistance ($R_x$) or inductance ($L_x$) and series resistance ($R_{xL}$) is to be measured is connected across the first and second test terminals 23 and 25, as illustrated in FIG. 3.

As illustrated in FIG. 4, the current based input signal, $i_{in}$, has the shape of a trapezoidal waveform. The trapezoidal waveform is positive going rather than negative going, as more fully described below. The second line of FIG. 4 illustrates the waveform of the output voltage, $V_{OUT}$, when the predominant parameter of the item being measured is resistance. The third or last line of FIG. 4 illustrates the waveform of the output voltage, $V_{OUT}$, when the item being measured includes both inductance and resistance.

As with the voltage based trapezoidal waveform illustrated on the first line of FIG. 2, the current based trapezoidal waveform illustrated on the first line of FIG. 4 has five (5) equal time domain intervals, each having a length equal to T. The time domain intervals are denoted by even numerical identifiers. The trapezoidal waveform starts at a first level and remains there for the first interval, i.e., from T0 to T2. Between T2 and T4 the excitation current, $i_{in}$, linearly increases from the first level to a second level. The excitation current remains constant at the second level for the third interval, i.e., between T4 and T6. From T6 to T8, the excitation current linearly decreases from the second level to the first level. The excitation current, $i_{in}$, remains at the second level for the fifth interval, i.e., from T8 to T10.

When the item being tested is simply a resistance, i.e., it has substantially no inductance parameter, the waveform of the output voltage, $V_{OUT}$, is also trapezoidal, as illustrated on the second line of FIG. 4. Using the analysis discussed above, it can be shown that the value of the unknown resistance in this instance can be determined in accordance with the following equation:

$$R_x = \frac{V_{T5} - V_{T1}}{I_{IN}} \quad (11)$$

where: $I_{IN}$ is the difference in the excitation current between the two levels, as illustrated in the first line of FIG. 4; and $V_{T5}$ and $V_{T1}$ are output voltage measurements made at times T5 and T1, respectively. (T5 lies midway between T4 and T6 and T1 lies midway between T0 and T2.)

If the item being measured has an inductance parameter as well as a resistance parameter, the inductance and resistance parameters are determined in accordance with the following equations:

$$L_x = \frac{V_{T3} - V_{T7}}{2 I_{IN}} T \quad (12)$$

$$R_{xL} = \frac{V_{T5} - V_{T9}}{I_{IN}} \quad (13)$$

where: $V_{T3}$, $V_{T7}$, $V_{T5}$ and $V_{T9}$ are the output voltage measured at times T3, T7, T5 and T9, respectively. (T3 lies midway between T2 and T4 and T9 lies midway between T8 and T10.)

When excited by a current based trapezoidal excitation signal of the type illustrated in FIG. 4, the circuit illustrated in FIG. 3 is ideally suited for measuring values of inductance in the range of 10 μH to 1H and values of resistance in the range 10 ohms to 320 ohms. Moreover, this circuit is ideally suited for simultaneously measuring the values of both the resistance (R) and inductance (L) parameters of a series RL item.

In summary, at this point, it will be appreciated that the invention contemplates applying either a current or a voltage based excitation signal having a predetermined shape to the item whose R, L or C parameters are to be measured and measuring the resulting output voltage at predetermined points in the time domain of the output voltage waveform. When circuits of the type illustrated in FIGS. 1 and 3 are utilized, preferably, the shape of the current or voltage bases excitation is regular, i.e., the second half of the waveform is a mirror image of the first half. Moreover, preferably, the waveform is in the shape of a trapezoid. Further, when these circuits are utilized to measure the R, L or C parameters of electronic components connected in-circuit, preferably, the peak-to-peak voltage of the excitation signal is below the activation voltage of active components connected in-circuit with the component whose R, L or C parameters are to be measured. After the output voltage measurements are made, they are mathematically combined with other known (or measurable) values to determine the resistance, inductance or capacitance of the item (e.g., component) whose parameters are being measured.

FIG. 5 is a schematic diagram of a circuit formed in accordance with the invention that is ideally suited for use in measuring the resistance ($R_x$) and capacitance ($C_x$) parameters of an item having series resistance and capacitive parameters, when a current based excitation signal, $i_{in}$, having a waveform of the type illustrated in the first line of FIG. 6 is applied. The circuit illustrated in FIG. 5 is substantially identical to the circuit illustrated in FIG. 3 in that it includes an input terminal 27 connected to an output terminal 29. Further, both the input and output terminals 27 and 29 are connected to a first test terminal 31. A second test terminal 33 is connected to ground. The item whose series resistance and capacitance values are to be measured is connected across the first and second test terminals, as shown.

The current based excitation signal is applied to the input terminal. As illustrated in FIG. 6, the current based excitation signal, $i_{in}$, has a dual polarity rectangular waveform that includes five equal segments each having a time duration equal to T. As before, the time intervals are denoted by even numerical identifiers. Between T0 and T2, the excitation signal is at a first level, which may be zero (0). At T2, the excitation signal rises to a second level and remains there from T2 to T4. At T4 the excitation signal drops back to the first or zero (0) level and remains there until T6. At T6 the excitation signal drops to a third level and remains there from T6 to T8. At T8 the excitation signal returns to the first or zero (0) level and remains there until the end of the overall cycle, i.e., until T10. The current difference between the first and second levels is positive and equal to $+I_{IN}$. The current difference between the first and third levels is negative and equal to $-I_{IN}$. Further, the absolute value of $+I_{IN}$ is equal to the absolute value of $-I_{IN}$. The waveform of the output voltage taken across the series RC item is illustrated in the second line of FIG. 6.

As with the previously described circuits, i.e., the circuits illustrated in FIGS. 1 and 3, it can be mathematically shown that the capacitive portion of the series RC item, $C_x$, can be determined in accordance with the following equation:

$$C_x = \frac{I_{IN} T}{V_{T5} - V_{T9}} \tag{14}$$

where $I_{IN}$ is the absolute value of $+I_{IN}$ or $-I_{IN}$ and $V_{T5}$ and $V_{T9}$ are the value of the output voltage at T5 and T9, respectively. (T5 is midway between T4 and T6 and T9 is midway between T8 and T10, as illustrated in FIG. 6)

In addition, it can be mathematically shown that the resistance portion of the RC series circuit, $R_x$, can be determined in accordance with the following equation:

$$R_x = \frac{V_{T3} - V_{T7}}{2 I_{IN}} \tag{15}$$

where $V_{T3}$ and $V_{T7}$ are the value of the output voltage at T3 and T7, respectively. (T3 is midway between T2 and T4, and T7 is midway between T6 and T8.) In both instances, $I_{IN}$ is a known (or measured) value.

It can be readily seen from the foregoing discussion that a single measurement cycle is adequate to measure the values of both $R_x$ and $C_x$. Moreover, the circuit has the advantage that it results in zero (0) charge being left on the capacitor at the end of the measurement cycle.

FIG. 7 is a block diagram of a high speed resistance, capacitance and inductance measurement system formed in accordance with the invention. Specifically, FIG. 7 illustrates a measurement apparatus formed in accordance with the invention adapted to apply voltage and current based excitation signals having waveforms of the type illustrated on the first lines of FIGS. 2, 4 and 6 to circuits of the types illustrated on FIGS. 1, 3 and 5, respectively. FIG. 7 also includes apparatus for measuring the output voltage of such circuits at predetermined points in time domain of the output voltage waveform and using the measured voltage information to determine the values of the R, L or C parameter(s). FIG. 7 includes: a precision DC reference voltage source 41; a programmable waveform generator 43; a precision clock generator 45; a voltage-to-current converter 47; a first test circuit 49 of the type illustrated in FIG. 1; a second test circuit 51 of the type illustrated in FIGS. 3 and 5; a sample and hold circuit 53; a high speed analog-to-digital converter 55; a time base generator 57; a signal processor 59; and, a display 61.

The stable DC output of the precision DC reference voltage source 41 is applied to the voltage input of the programmable waveform generator 43. A suitable output of the precision clock generator 45 is connected to the clock input of the programmable waveform generator. As illustrated in parentheses, the programmable waveform generator 23 produces the trapezoidal and dual polarity rectangular waveform excitation signals previoulsy described. The required signal is produced in voltage based form. When current based signals are required the voltage-to-current converter 27 converts the signal produced by the programmable waveform generator from a voltage base to a current base. More specifically, the voltage based excitation signal, $e_{in}$, produced by the programmable waveform generator and directly applied to the input 63 of the first test circuit 49. The current based excitation signals, $i_{in}$, is first produced in voltage based form by the programmable waveform generator 43, converted to current based form by the voltage-to-current converter and, then, applied to the input 65 of the second test circuit 51.

As with the test circuit illustrated in FIG. 1, the input 63 of the first test circuit 49 is connected to a first test terminal 67. The unknown 71 whose resistance and/or capacitance parameter values are to be measured is connected between the first test terminal 67 and a second test terminal 69. The second test terminal 69 is connected to the inverting input of an operational amplifier 73. The noninverting input of the operational amplifier 73 is connected to ground. A reset switch 75 is connected between the inverting input of the operational amplifier 73 and the output of the operational amplifier. The inverting input of the operational amplifier 29 is also connected to one end of each of three standard capacitors designated $C_{s1}$, $C_{s2}$ and $C_{s3}$. The other end of $C_{s1}$ is connected to one side of a first range switch 77 and to one side of a first output switch 83. The other end of $C_{s2}$ is connected to one side of a second range switch 79 and to one side of a second output switch 85. The other end of $C_{s3}$ is connected to one side of a third range switch 81 and one side of a third output switch 87. The other side of the first, second and third range switches 77, 79 and 81, are connected to the output of the operational amplifier 73. The output of the operational amplifier 73 is also connected to one side of a first isolation switch 89. The other side of the first, second and third output switches 83, 85, and 87 and the first isolation switch 89 are connected together. this junction is connected to the output 91 of the first test circuit, which is connected to the signal input of the sample and hold circuit 53.

The input 65 of the second test circuit 51 is connected to a third test terminal 93. A fourth test terminal 95 is connected to ground. Unknown electronic items 97 whose resistance, inductance and/or capacitance parameters are to be measured in circuits of the types illustrated in FIGS. 3 and 5 are connected across the third and fourth test terminals 93 and 95. The input 65 of the second test circuit 51 is also connected to one side of a second isolation switch 99. The other side of the second isolation switch 99 is the output of the second test circuit 51. This output is connected to the same output terminal 91 as the output of the first test circuit 49, which output terminal is connected to the signal input of the sample and hold circuit 53. The output of the sample and hold circuit is connected to the input of the high speed analog-to-digital converter 55.

A suitable output of the precision clock generator 45 is connected to the clock input of the time base generator 57. The time base generator 57 is a counter that produces control pulses each time a predetermined number of pulses have been produced by the precision clock generator 45. One control pulse output of the time base generator 57 is connected to the control input of the sample and hold circuit 53 and a second control pulse output is connected to the control input of the high speed analog-to-digital converter 55. A third control pulse output is connected to a control signal input of the signal processor 59. The high speed analog-to-digital converter and the signal processor also receive clock pulses either directly from the precision clock generator 45 or indirectly from the time base generator 57. For ease of illustration, none of these clock pulse paths are shown in FIG. 7. The parallel digital output of the high speed analog-to-digital converter 55 is connected to the signal input of the signal processor 59. The signal processor 55 has a data output that is connected to the display 61.

As will be readily appreciated by those skilled in the art and others from the foregoing description, FIG. 7 is a simplified illustration of a high speed resistance, inductance and capacitance measurement apparatus formed in accordance with the invention. In this regard, while illustrated as blocks, the reset, range, output and isolation switches are, preferably, solid state switches, such as field effect transistor switches. The switches are controlled by the state (high or low) of signals applied to the control inputs (e.g. gates) of the switches, as required. The control signals may be produced by manually controlled switches, or by a suitable automatic sequence controller, which may form part of the signal processor, depending upon how an actual embodiment of the invention is constructed. In this regard, it should be noted that the reset switch 75 is "closed" at the end of each measurement cycle of the first test circuit 49 in order to discharge any residual charge on the standard capacitor $C_{s1}$, $C_{s2}$ or $C_{s3}$ connected in the feedback path of the operational amplifier 73.

When the first test circuit 49 is to be used to measure the resistance and/or capacitance parameters of an unknown 71, the appropriate one of the three ranges switches 77, 79 and 81 is closed. As a result, $C_{s1}$, $C_{s2}$ or $C_{s3}$ is connected in the feedback path of the operational amplifier 73. At the same time the related one of the three output switches 83, 85 and 87 is closed. For example, if the first range switch 77 is closed, the first output switch 83 is closed. The other range and output switches are open. Further, the isolation switch 89 is open, as is the isolation switch 99 of the second test circuit 51. As a result, the charge on the chosen one of $C_{s1}$, $C_{s2}$ and $C_{s3}$ is tracked by the input of the sample and hold circuit 53. At this point the first test circuit is in a form identical to that illustrated in FIG. 1 and previously described. The reason that the junction between the selected standard capacitor, ($C_{s1}$, $C_{s2}$ or $C_{s3}$) and its associated range switch is connected by an output switch to the input of the sample and hold circuit 53, rather than the output of the operational amplifier 73 being connected via the first isolation switch 89 to the input of the sample and hold circuit 53, is to eliminate errors caused by the voltage drop across the range switch.

After the first test circuit 49 has been set in the manner just described (and the unknown connected across the first and second test terminals 67 and 69), the programmable waveform generator is adjusted to produce an excitation signal of the type illustrated in the first line of FIG. 2. Depending upon the resistance/capacitance nature of the unknown 71, the output voltage waveform of the first test circuit 49 is one of the types illustrated in the second, third and fourth lines of FIG. 2. The sample and hold circuit 53 tracks the output voltage. At the required odd time intervals (T1, T3, T5, T7 or T9), the time base generator 57 applies a hold control pulse to the sample and hold circuit 53. When this occurs, the sample and hold circuit stops tracking the output of the first test circuit 49 and stores the then present output, i.e., the output voltage existing when the hold control pulse is produced. Immediately thereafter the high speed analog-to-digital converter 51 is actuated to convert the analog output of the sample and hold circuit into parallel digital form, which form is then read and stored by the signal processor 55. Then, the sample and hold circuit is returned to its sample mode of operation. The output of the first test circuit is thereafter tracked by the sample and hold circuit until the next measurement point in the time domain of the output voltage waveform occurs.

After all of the required output voltage measurements are made, the signal processor 59 functions in accordance with the appropriate one of the previously described equations to produce signals representing the resistance and/or capacitance being measured. As required, the signal processor measures (or receives from a suitable memory) the peak-to-peak voltage ($V_{IN}$) of the trapezoidal excitation signal and the value of T. After performing the mathematical steps of the appropriate equation, the signal processor 59 produces a suitable display control signal, which is applied to the display 61.

When the second test circuit 51 is to be used to measure the resistance, inductance or capacitance parameters of an unknown 97, the isolation switch 99 of the second test circuit is closed. In this case the three output switches 83, 85 and 87, and the isolation switch 89, of the first test circuit 49 are all open. After the switches are adjusted in the foregoing manner, the programmable waveform generator is adjusted to produce a voltage based excitation signal having the form of the current based excitation signal illustrated on the first lines of FIG. 4 or 6, as required. The voltage based excitation signal is converted to current form by the voltage-to-current converter 47. The current based excitation signal is applied to the unknown 97 via the third test terminal 93. The output voltage produced across the unknown as a result of the excitation signal is tracked by the sample and hold circuit 53. As before, the sample and hold circuit 53 is controlled by hold control signals produced by the time based generator 53 to temporarily store the output of the second test circuit 49 at the appropriate points in the time domain of the output voltage waveform until the stored voltages are converted from analog form to digital form by the high speed analog-to-digital converter 55 and stored in the signal processor 59. After all of the required voltages have been converted, received and stored, the signal processor 55 functions in accordance with the appropriate equation to produce an output representing the valve of the resistance, inductance or capacitance parameter of the item being measured.

As will be readily appreciated by those skilled in the electrical measuring and testing art from the foregoing description, the invention provides a method and apparatus for the high speed measurement of the value of the resistance, inductance or capacitance parameters of an electronic item, such as an electronic component or circuit. The invention can be utilized to quickly measure resistance, inductance and capacitance values over relatively wide ranges. In addition, because the voltage level of the excitation signal can be made relatively low, the invention can be utilized to measure the resistance, capacitance and inductance of electronic components mounted "in-circuit." This results can be achieved without any significant loss of accuracy, when compared to the accuracy of the results achievable when the component is disconnected from its associated circuitry.

While a preferred embodiment of the invention has been illustrated and described, it will be appreciated that various changes can be made therein without departing from the spirit and scope of the invention. In this regard, while preferred waveforms of the excitation signal are trapezoidal and dual polarity rectangular, other waveforms can be used if desired. Regardless of its exact shape, the waveform must be regular, i.e., the second half must be a mirror image of the first half (even though the polarity may be changed as in the illustrated dual polarity rectangular wave illustrated and described). Hence, the invention can be practiced otherwise than as specifically described herein.

The embodiments of the invention in which an exclusive property or privilege is claimed are defined as follows:

1. A method of measuring the value of one or more of the resistance, inductance, or capacitance parameters of an unknown item having said parameters in a known configuration, said method comprising the steps of:
    applying an excitation signal to said unknown items, said excitation signal having a waveform of a predetermined shape containing piecewise linear portions;
    measuring the magnitude of an output waveform signal created by the application of said excitation signal to said unknown item at predetermined times during a single cycle of the excitation signal; and
    in response to said excitation signal and said measured output waveform signal, generating a signal representing the value of the parameter whose value is being measured.

2. The method as claimed in claim 1 wherein the waveform of said excitation signal has a peak voltage magnitude insufficient to activate any electronic components connected to said unknown item.

3. The method as claimed in claim 2 wherein said excitation signal has a trapezoidal waveform.

4. The method claimed in claim 3 wherein said trapezoidal excitation signal includes five segments, said excitation signal being at a first voltage level during said first and fifth segments, said excitation signal being at a second level during said third segment, said excitation signal linearly changing from said first level to said second level during said second segment and said excitation signal linearly changing from said second level to said first level during said fourth segment.

5. The method as claimed in claim 2 wherein said excitation signal is current based.

6. The method as claimed in claim 5 wherein said excitation signal is trapezoidal with five segments, said excitation signal being at a first current level during said first and fifth segments, said excitation signal being at a second current level during said third segment, said excitation signal linearly changing from said first to said second level during said second segment, and said excitation signal linearly changing from said second level to said first level during said fourth segment.

7. The method claimed in claim 1 wherein the shape of the waveform of said excitation signal is dual polarity rectangular.

8. The method claimed in claim 7 wherein said excitation signal is current based.

9. The method claimed in claim 8 wherein said dual polarity rectangular excitation signal includes five segments, said excitation current signal being at a first level during said first, third, and fifth segments, said excitation signal being at a second level above said first level during said second segment and said excitation signal being at a third level below said first level during said fourth segment.

10. The method claimed in claim 9 wherein the difference in said current based excitation signal between said first and second levels is the same as the difference between said first and third levels.

11. Apparatus for measuring the value of one or more of the resistance, inductance, or capacitance parameters of an unknown item having said parameters in a known configuration, said apparatus comprising:
excitation signal generating means for generating an excitation signal, the waveform of said excitation signal having a predetermined shape containing piecewise linear portions;
test circuit means coupled to said excitation signal generating means for applying said excitation signal to said unknown items;
measuring means coupled to said test circuit means for measuring the magnitude of an output waveform created by the application of said excitation signal to said unknown item at predetermined times during a single cycle of the excitation signal; and
signal processor means responsive for providing a signal representing the value of the parameter whose value is being measured by processing using the value of said excitation signal and said measured magnitude values.

12. The apparatus as claimed in claim 11 wherein the peak magnitude of said excitation signal is insufficient to activate any electronic components connected to said unknown item.

13. Apparatus as claimed in claim 12 wherein said excitation signal has a trapazoidal waveform.

14. Apparatus as claimed in claim 13 wherein said voltage based excitation signal is trapezoidal with five segments, said excitation signal being at a first voltage level during said first and fifth segments, said excitation signal being at a second voltage level during said third segment, and said excitation signal linearly changing from said first level to said second level during said second segment and said excitation signal linearly changing from said second level to said first level during said fourth segment.

15. Apparatus as claimed in claim 14 wherein said test circuit means includes first and second test terminals and an integrator comprising an operational amplifier and a feedback capacitor having a capacitance value represented by $C_s$, said test terminals being connected in series with the input of said operational amplifier and said feeback being connected between the input and the output of said operational amplifier.

16. Apparatus as claimed in claim 15 wherein said five segments of said trapezoidal excitation signal are of equal time duration, each of which is represented by T, and wherein said measuring means measures the magnitude of the output voltage in the mid-region of selected ones of said five excitations signal segments.

17. Apparatus as claimed in claim 16 wherein the parameter whose value is to be measured in capacitance and wherein said capacitance, denoted $C_x$ is determined by said combining means in accordance with the following equation:

$$C_x = -\frac{(V_{T5} - V_{T1})C_s}{V_{IN}}$$

wherein: $V_{T5}$ is the magnitude of the output voltage measured by said measuring means in the mid-region of said third segment; $V_{T1}$ is the magnitude of the output voltage measured by said measuring in the mid-region of said first or fifth segments; $C_s$ is the capacitance value of the feedback capacitor; and, $V_{IN}$ is the magnitude of the excitation voltage difference between said first and second voltage levels.

18. Apparatus as claimed in claim 16 wherein the parameter whose value to be measured is resistance and wherein said resistance, denoted $R_x$, is determined by said combining means in accordance with the following equation:

$$R_x = -\frac{2 V_{IN} T}{C_s(V_{T9} - V_{T1})}$$

wherein: $V_{IN}$ is the magnitude of the excitation voltage difference between the first and second voltage levels; T is the value of any of the equal time duration segments; $C_s$ is the capacitance value of the feedback capacitor; $V_{T9}$ is the magnitude of the output voltage measured by said measuring means in the mid-region of said fifth segment; and $V_{T1}$ is the output voltage measured by the measuring means in the mid-region of the first segment.

19. Apparatus as claimed in claim 18 wherein the value of the capacitance of the unkown item is also to be measured and wherein said capacitance, denoted $C_x$, is determined by said combing means in accordance with the following equation:

$$C_x = -\frac{V_{T5} - \frac{1}{2}V_{T9}}{V_{IN}} C_s$$

wherein: $V_{T5}$ is the magnitude of the output voltage measured by said measuring means in the mid-region of said third segment; $V_{T9}$ is the magnitude of the output voltage measured by said measuring means in the mid-region of said fifth segment; $C_s$ is the capacitance value of the feedback capacitor; and, $V_{IN}$ is the magnitude of the excitation voltage difference between the first and second voltage levels.

20. Apparatus as claimed in claim 12 wherein said excitation signal is current based.

21. Apparatus as claimed in claim 20 wherein said current based excitation signal is trapezoidal with five segments, said excitation signal being at a first current level during said first and fifth segments, said excitation signal being at a second current level during said third segment, said excitation signal linearly changing from said first level to said second level during said second segment, and said excitation signal linearly changing from said second level to said first level during said fourth segment.

22. Apparatus as claimed in claim 21 wherein said test circuit includes first and second test terminals, said first test terminal connected to said excitation signal generating means to receive said current based trapezoidal excitation signal and said second terminal connected to ground.

23. Apparatus as claimed in claim 22 wherein said five segments of said current based trapezoidal excitation signal are of equal time duration, each of which is represented by T, and wherein said measuring means measures the magnitude of the output voltage in the mid-region of selected ones of said five excitation signal segments.

24. Apparatus as claimed in claim 23 wherein the parameter whose value is to be measured is resistance and wherein said resistance, denoted $R_x$, is determined by said combining means in accordance with the following equation:

$$R_x = \frac{V_{T5} - V_{T1}}{I_{IN}}$$

wherein: $V_{T5}$ is the magnitude of the output voltage measured by said measuring means in the mid-region of said third segment; $V_{T1}$ is the magnitude of the output voltage measured by said measuring means in the mid-region of said first segment; and, $I_{IN}$ is the magnitude of the excitation current difference between said first and second current levels.

25. Apparatus as claimed in claim 23 wherein the parameter whose value is to be measured is inductance and wherein said inductance, denoted $L_x$, is determined by said combining means in accordance with the following equation:

$$L_x = \frac{V_{T3} - V_{T7}}{2 I_{IN}} T$$

wherein: $V_{T3}$ is the magnitude of the output voltage measured by said measuring means in the mid-region of said second segment; $V_{T7}$ is the magnitude of the output voltage measured by said measuring means in the mid-region of said fourth segment; T is the value of any of the equal time duration segments; and, $I_{IN}$ is the magnitude of the excitation current difference between said first and second current levels.

26. Apparatus as claimed in claim 25 wherein the magnitude of the resistance of said unknown item is also to be measured and wherein said resistance, denoted $R_{xL}$, is determined by said combining means in accordance with the following equation:

$$R_{xL} = \frac{V_{T5} - V_{T9}}{I_{IN}}$$

wherein: $V_{T5}$ is the magnitude of the output voltage measured by said measuring means in the mid-region of said third segment; $V_{T9}$ is the magnitude of the output voltage measured by said measuring means in the mid-region of said fifth segment; and, $I_{IN}$ is the magnitude of the current difference between the first and second levels.

27. Apparatus as claimed in claim 11 wherein the shape of the waveform of said excitation signal is dual polarity rectangular.

28. Apparatus as claimed in claim 27 wherein said dual polarity rectangular excitation signal is current based.

29. Apparatus as claimed in claim 28 wherein said current based dual polarity rectangular excitation signal has five segments, said excitation signal being at a first current level during said first, third and fifth segments, said excitation signal being at a second current level above said first current level during said second segment and said excitation signal being at a third current level below said first current level during said fourth segment.

30. Apparatus as claimed in claim 29 wherein said test circuit includes first and second test terminals, said first terminal connected to said excitation signal generating means to receive said current based dual polarity rectangular excitation signal and said second terminal connected to ground.

31. Apparatus as claimed in claim 30 wherein the magnitude of the current difference between said first level and said second level equals the current difference between said first level and said third level.

32. Apparatus as claimed in claim 31 wherein said five segments of said current based dual polarity excitation signal are of equal time duration, each of which is represented by T, and wherein said measuring means measures the magnitude of the output voltage in the mid-region of selected ones of said five excitation signal segments.

33. Apparatus as claimed in claim 32 wherein the parameter whose value is to be measured is capacitance and wherein said capacitance, denoted $C_x$, is determined by said combining means in accordance with the following equation:

$$C_x = \frac{I_{IN} T}{V_{T5} - V_{T9}}$$

wherein: $I_{IN}$ is the magnitude of the current between said first and second current levels or said first and third currents; T is the value of any of the equal time duration segments; $V_{T5}$ is the magnitude of the output voltage measured by said measuring means in the mid-region of said third segment; and, $V_{T9}$ is the magnitude of the output voltage in the mid-region of the fifth segment.

34. Apparatus as claimed in claim 32 wherein the parameter whose value is to be measured is resistance and wherein said resistance, denoted $R_x$, is determined by said combining means in accordance with the following equation:

$$R_x = \frac{V_{T3} - V_{T7}}{2 I_{IN}}$$

wherein: $V_{T3}$ is the magnitude of the output voltage measured by said measuring means in the mid-region of said second segment; $V_{T7}$ is the magnitude of the output voltage measured by said measuring means in the mid-region of said fourth segment; and, $I_{IN}$ is the magnitude of the current difference between said first and second levels or said first and third levels.

* * * * *